(12) United States Patent
Zhang et al.

(10) Patent No.: US 8,443,271 B1
(45) Date of Patent: May 14, 2013

(54) SYSTEMS AND METHODS FOR DUAL PROCESS DATA DECODING

(75) Inventors: Fan Zhang, Milpitas, CA (US); Lei Chen, Santa Clara, CA (US); Zongwang Li, San Jose, CA (US); Shaohua Yang, San Jose, CA (US); Yang Han, Sunnyvale, CA (US); Wu Chang, Santa Clara, CA (US)

(73) Assignee: LSI Corporation, San Jose, CA (US)

( * ) Notice: Subject to any disclaimer, the term of this patent is extended or adjusted under 35 U.S.C. 154(b) by 45 days.

(21) Appl. No.: 13/284,730

(22) Filed: Oct. 28, 2011

(51) Int. Cl.
*H03M 13/03* (2006.01)

(52) U.S. Cl.
USPC .......................................................... 714/794

(58) Field of Classification Search .................. 714/794, 714/807; 375/341
See application file for complete search history.

(56) References Cited

U.S. PATENT DOCUMENTS

| | | | |
|---|---|---|---|
| 5,278,703 A | 1/1994 | Rub | |
| 5,278,846 A | 1/1994 | Okayama et al. | |
| 5,325,402 A | 6/1994 | Ushirokawa | |
| 5,392,299 A | 2/1995 | Rhines et al. | |
| 5,471,500 A | 11/1995 | Blaker et al. | |
| 5,513,192 A | 4/1996 | Janku et al. | |
| 5,523,903 A | 6/1996 | Hetzler et al. | |
| 5,550,870 A | 8/1996 | Blaker et al. | |
| 5,612,964 A | 3/1997 | Haraszti | |
| 5,701,314 A | 12/1997 | Armstrong et al. | |
| 5,710,784 A | 1/1998 | Kindred et al. | |
| 5,712,861 A | 1/1998 | Inoue et al. | |
| 5,717,706 A | 2/1998 | Ikeda | |
| 5,768,044 A | 6/1998 | Hetzler | |
| 5,802,118 A | 9/1998 | Bliss et al. | |
| 5,844,945 A | 12/1998 | Nam et al. | |
| 5,898,710 A | 4/1999 | Amrany | |
| 5,923,713 A | 7/1999 | Hatakeyama | |
| 5,978,414 A | 11/1999 | Nara | |
| 5,983,383 A | 11/1999 | Wolf | |
| 6,005,897 A | 12/1999 | McCallister et al. | |
| 6,023,783 A | 2/2000 | Divsalar et al. | |
| 6,029,264 A | 2/2000 | Kobayashi et al. | |

(Continued)

FOREIGN PATENT DOCUMENTS

| | | |
|---|---|---|
| EP | 0522578 | 1/1993 |
| EP | 0631277 | 12/1994 |

(Continued)

OTHER PUBLICATIONS

U.S. Appl. No. 11/461,026, filed Jul. 31, 2006, Tan, Weijun.

(Continued)

*Primary Examiner* — Sam Rizk
(74) *Attorney, Agent, or Firm* — Hamilton, DeSanctis & Cha

(57) ABSTRACT

Various embodiments of the present invention provide systems and methods for data processing. For example, data processing systems are disclosed that include a data decoding system. The data decoding system includes a data decoder circuit and a simplified maximum likelihood value modification circuit. The data decoder circuit is operable to apply a data decode algorithm to a decoder input to yield a first decoded output and an indication of at least one point of failure of the first decoded output. The simplified maximum likelihood value modification circuit is operable to identify a symbol of the first decoded output associated with the point of failure, and to modify a subset of values associated with the identified symbol to yield a modified decoded output.

20 Claims, 7 Drawing Sheets

U.S. PATENT DOCUMENTS

| | | | |
|---|---|---|---|
| 6,041,432 A | 3/2000 | Ikeda | |
| 6,065,149 A | 5/2000 | Yamanaka | |
| 6,097,764 A | 8/2000 | McCallister et al. | |
| 6,145,110 A | 11/2000 | Khayrallah | |
| 6,216,249 B1 | 4/2001 | Bliss et al. | |
| 6,216,251 B1 | 4/2001 | McGinn | |
| 6,229,467 B1 | 5/2001 | Eklund et al. | |
| 6,266,795 B1 | 7/2001 | Wei | |
| 6,317,472 B1 | 11/2001 | Choi et al. | |
| 6,351,832 B1 | 2/2002 | Wei | |
| 6,366,624 B1* | 4/2002 | Balachandran et al. | 375/341 |
| 6,377,610 B1 | 4/2002 | Hagenauer et al. | |
| 6,381,726 B1 | 4/2002 | Weng | |
| 6,438,717 B1 | 8/2002 | Butler et al. | |
| 6,473,878 B1 | 10/2002 | Wei | |
| 6,476,989 B1 | 11/2002 | Chainer et al. | |
| 6,553,536 B1* | 4/2003 | Hassner et al. | 714/780 |
| 6,625,775 B1 | 9/2003 | Kim | |
| 6,657,803 B1 | 12/2003 | Ling et al. | |
| 6,671,404 B1 | 12/2003 | Kawatani et al. | |
| 6,748,034 B2 | 6/2004 | Hattori et al. | |
| 6,757,862 B1 | 6/2004 | Marianetti | |
| 6,785,863 B2 | 8/2004 | Blankenship et al. | |
| 6,788,654 B1 | 9/2004 | Hashimoto et al. | |
| 6,810,502 B2 | 10/2004 | Eidson | |
| 6,980,382 B2 | 12/2005 | Hirano et al. | |
| 6,986,098 B2 | 1/2006 | Poeppelman et al. | |
| 7,010,051 B2 | 3/2006 | Murayama et al. | |
| 7,047,474 B2 | 5/2006 | Rhee et al. | |
| 7,058,873 B2 | 6/2006 | Song et al. | |
| 7,073,118 B2 | 7/2006 | Greenberg et al. | |
| 7,093,179 B2 | 8/2006 | Shea | |
| 7,113,356 B1 | 9/2006 | Wu | |
| 7,136,244 B1 | 11/2006 | Rothberg | |
| 7,173,783 B1 | 2/2007 | McEwen et al. | |
| 7,184,486 B1 | 2/2007 | Wu et al. | |
| 7,191,378 B2 | 3/2007 | Eroz et al. | |
| 7,203,015 B2 | 4/2007 | Sakai et al. | |
| 7,203,887 B2 | 4/2007 | Eroz et al. | |
| 7,236,757 B2 | 6/2007 | Raghavan et al. | |
| 7,257,764 B2 | 8/2007 | Suzuki et al. | |
| 7,310,768 B2 | 12/2007 | Eidson et al. | |
| 7,313,750 B1 | 12/2007 | Feng et al. | |
| 7,370,258 B2 | 5/2008 | Iancu et al. | |
| 7,403,752 B2 | 7/2008 | Raghavan et al. | |
| 7,430,256 B2 | 9/2008 | Zhidkov | |
| 7,502,189 B2 | 3/2009 | Sawaguchi et al. | |
| 7,505,537 B1 | 3/2009 | Sutardja | |
| 7,523,375 B2 | 4/2009 | Spencer | |
| 7,587,657 B2 | 9/2009 | Haratsch | |
| 7,589,372 B2 | 9/2009 | Shin et al. | |
| 7,590,168 B2 | 9/2009 | Raghavan et al. | |
| 7,702,989 B2 | 4/2010 | Graef et al. | |
| 7,712,008 B2 | 4/2010 | Song et al. | |
| 7,738,201 B2 | 6/2010 | Jin et al. | |
| 7,752,523 B1 | 7/2010 | Chaichanavong | |
| 7,801,200 B2 | 9/2010 | Tan | |
| 7,802,163 B2 | 9/2010 | Tan | |
| 2003/0063405 A1 | 4/2003 | Jin et al. | |
| 2003/0081693 A1 | 5/2003 | Raghavan et al. | |
| 2003/0087634 A1 | 5/2003 | Raghavan et al. | |
| 2003/0112896 A1 | 6/2003 | Raghavan et al. | |
| 2003/0134607 A1 | 7/2003 | Raghavan et al. | |
| 2004/0071206 A1 | 4/2004 | Takatsu | |
| 2004/0098659 A1 | 5/2004 | Bjerke et al. | |
| 2005/0010855 A1 | 1/2005 | Lusky | |
| 2005/0078399 A1 | 4/2005 | Fung | |
| 2005/0111540 A1 | 5/2005 | Modrie et al. | |
| 2005/0157780 A1 | 7/2005 | Werner et al. | |
| 2005/0195749 A1 | 9/2005 | Elmasry et al. | |
| 2005/0216819 A1 | 9/2005 | Chugg et al. | |
| 2005/0273688 A1 | 12/2005 | Argon | |
| 2006/0020872 A1 | 1/2006 | Richardson et al. | |
| 2006/0031737 A1 | 2/2006 | Chugg et al. | |
| 2006/0123285 A1 | 6/2006 | De Araujo et al. | |
| 2006/0140311 A1 | 6/2006 | Ashley et al. | |
| 2006/0168493 A1 | 7/2006 | Song et al. | |
| 2006/0195772 A1 | 8/2006 | Graef et al. | |
| 2006/0210002 A1 | 9/2006 | Yang et al. | |
| 2006/0248435 A1 | 11/2006 | Haratsch | |
| 2006/0256670 A1 | 11/2006 | Park et al. | |
| 2007/0011569 A1 | 1/2007 | Vila Casado et al. | |
| 2007/0047121 A1 | 3/2007 | Elefeheriou et al. | |
| 2007/0047635 A1 | 3/2007 | Stojanovic et al. | |
| 2007/0110200 A1 | 5/2007 | Mergen et al. | |
| 2007/0230407 A1 | 10/2007 | Petrie et al. | |
| 2007/0286270 A1 | 12/2007 | Huang et al. | |
| 2008/0049825 A1 | 2/2008 | Chen et al. | |
| 2008/0055122 A1 | 3/2008 | Tan | |
| 2008/0065970 A1 | 3/2008 | Tan | |
| 2008/0069373 A1 | 3/2008 | Jiang et al. | |
| 2008/0168330 A1 | 7/2008 | Graef et al. | |
| 2008/0276156 A1 | 11/2008 | Gunnam | |
| 2008/0301521 A1 | 12/2008 | Gunnam | |
| 2009/0185643 A1 | 7/2009 | Fitzpatrick et al. | |
| 2009/0199071 A1 | 8/2009 | Graef | |
| 2009/0235116 A1 | 9/2009 | Tan et al. | |
| 2009/0235146 A1 | 9/2009 | Tan | |
| 2009/0259915 A1 | 10/2009 | Livshitz et al. | |
| 2009/0273492 A1 | 11/2009 | Yang et al. | |
| 2009/0274247 A1 | 11/2009 | Galbraith et al. | |
| 2010/0002795 A1 | 1/2010 | Raghavan et al. | |
| 2010/0042877 A1 | 2/2010 | Tan | |
| 2010/0042890 A1 | 2/2010 | Gunnam | |
| 2010/0050043 A1 | 2/2010 | Valentin Savin | |
| 2010/0061492 A1 | 3/2010 | Noeldner | |
| 2010/0070837 A1 | 3/2010 | Xu et al. | |
| 2010/0164764 A1 | 7/2010 | Nayak | |
| 2010/0185914 A1 | 7/2010 | Tan et al. | |
| 2011/0075569 A1 | 3/2011 | Marrow et al. | |
| 2011/0080211 A1 | 4/2011 | Yang et al. | |
| 2011/0167246 A1 | 7/2011 | Yang et al. | |

FOREIGN PATENT DOCUMENTS

| | | |
|---|---|---|
| EP | 1814108 | 8/2007 |
| WO | WO 2006/016751 | 2/2006 |
| WO | WO 2006/134527 | 12/2006 |
| WO | WO 2007/091797 | 8/2007 |
| WO | WO 2010/126482 | 4/2010 |
| WO | WO 2010/101578 | 9/2010 |

OTHER PUBLICATIONS

U.S. Appl. No. 11/461,198, filed Jul. 31, 2006, Tan, Weijun.
U.S. Appl. No. 11/461,283, filed Jul. 31, 2006, Tan, Weijun.
U.S. Appl. No. 12/540,283, filed Aug. 12, 2009, Liu, et al.
U.S. Appl. No. 12/652,201, filed Jan. 5, 2010, Mathew, et al.
U.S. Appl. No. 12/763,050, filed Apr. 19, 2010, Ivkovic, et al.
U.S. Appl. No. 12/792,555, filed Jun. 2, 2010, Liu, et al.
U.S. Appl. No. 12/887,317, filed Sep. 21, 2010, Xia, et al.
U.S. Appl. No. 12/887,330, filed Sep. 21, 2010, Zhang, et al.
U.S. Appl. No. 12/887,369, filed Sep. 21, 2010, Liu, et al.
U.S. Appl. No. 12/901,816, filed Oct. 11, 2010, Li, et al.
U.S. Appl. No. 12/901,742, filed Oct. 11, 2010, Yang.
U.S. Appl. No. 12/917,756, filed Nov. 2, 2010, Miladinovic, et al.
U.S. Appl. No. 12/947,931, filed Nov. 17, 2010, Yang, Shaohua.
U.S. Appl. No. 12/947,947, filed Nov. 17, 2010 Ivkovic, et al.
U.S. Appl. No. 12/972,942, filed Dec. 20, 2010, Liao, et al.
U.S. Appl. No. 12/992,948, filed Nov. 16, 2010, Yang, et al.
U.S. Appl. No. 13/021,814, filed Feb. 7, 2011, Jin, Ming, et al.
U.S. Appl. No. 13/031,818, filed Feb. 22, 2011, Xu, Changyou, et al.
U.S. Appl. No. 13/050,129, filed Mar. 17, 2011, Tan, et al.
U.S. Appl. No. 13/050,765, filed Mar. 17, 2011, Yang, et al.
U.S. Appl. No. 13/088,119, filed Apr. 15, 2011, Zhang, et al.
U.S. Appl. No. 13/088,146, filed Apr. 15, 2011, Li, et al.
U.S. Appl. No. 13/088,178, filed Apr. 15, 2011, Sun, et al.
U.S. Appl. No. 13/126,748, filed Apr. 28, 2011, Tan.
U.S. Appl. No. 13/167,764, filed Jun. 24, 2011, Li, Zongwang, et al.
U.S. Appl. No. 13/167,771, filed Jun. 24, 2011, Li, Zongwang, et al.
U.S. Appl. No. 13/167,775, filed Jun. 24, 2011, Li, Zongwang.
U.S. Appl. No. 13/186,146, filed Jul. 19, 2011, Mathew, et al.
U.S. Appl. No. 13/186,213, filed Jul. 19, 2011, Mathew, et al.
U.S. Appl. No. 13/186,234, filed Jul. 19, 2011, Xia, Haitao, et al.
U.S. Appl. No. 13/186,251, filed Jul. 19, 2011, Xia, Haitao, et al.

U.S. Appl. No. 13/186,174, filed Jul. 19, 2011, Mathew, et al.
U.S. Appl. No. 13/186,197, filed Jul. 19, 2011, Mathew, George et al.
U.S. Appl. No. 13/213,751, filed Aug. 19, 2011, Zhang, Fan, et al.
U.S. Appl. No. 13/213,808, filed Aug. 19, 2011 Jin, Ming.
U.S. Appl. No. 13/220,142, filed Aug. 29, 2011, Chang, Wu, et al.
U.S. Appl. No. 13/227,538, filed Sep. 8, 2011, Yang, Shaohua, et al.
U.S. Appl. No. 13/227,544, filed Sep. 8, 2011 Yang, Shaohua, et al.
U.S. Appl. No. 13/239,683, filed Sep. 22, 2011, Xu, Changyou.
U.S. Appl. No. 13/239,719, filed Sep. 22, 2011, Xia, Haitao, et al.
U.S. Appl. No. 13/251,342, filed Oct. 2, 2011, Xia, Haitao, et al.
U.S. Appl. No. 13/269,832, filed Oct. 10, 2011, Xia, Haitao, et al.
U.S. Appl. No. 13/269,852, filed Oct. 10, 2011, Xia, Haitao, et al.
U.S. Appl. No. 13/284,819, filed Oct. 28, 2011, Tan, Weijun, et al.
U.S. Appl. No. 13/284,730, filed Oct. 28, 2011, Zhang, Fan, et al.
U.S. Appl. No. 13/284,754, filed Oct. 28, 2011, Zhang, Fan, et al.
U.S. Appl. No. 13/284,767, filed Oct. 28, 2011, Zhang, Fan, et al.
U.S. Appl. No. 13/284,826, filed Oct. 28, 2011, Tan, Weijun, et al.
U.S. Appl. No. 13/295,150, filed Nov. 14, 2011, Li, Zongwang, et al.
U.S. Appl. No. 13/295,160, filed Nov. 14, 2011, Li, Zongwang, et al.
U.S. Appl. No. 13/251,340, filed Oct. 3, 2011, Xia, Haitao, et al.
Amer et al "Design Issues for a Shingled Write Disk System" MSST IEEE 26th Symposium May 2010.
Bahl, et al "Optimal decoding of linear codes for Minimizing symbol error rate", IEEE Trans. Inform. Theory, vol. 20, pp. 284-287, Mar. 1974.
Casado et al., Multiple-rate low-denstiy parity-check codes with constant blocklength, IEEE Transations on communications, Jan. 2009, vol. 57, pp. 75-83.
Collins and Hizlan, "Determinate State Convolutional Codes" IEEE Transactions on Communications, Dec. 1993.
Eleftheriou, E. et al., "Low Density Parity-Check Codes for Digital Subscriber Lines", Proc ICC 2002, pp. 1752-1757.
Fisher, R et al., "Adaptive Thresholding"[online] 2003 [retrieved on May 28, 2010] Retrieved from the Internet <URL:http://homepages.inf.ed.ac.uk/rbf/HIPR2/adpthrsh.htm.
Fossnorier, Marc P.C. "Quasi-Cyclic Low-Density Parity-Check Codes From Circulant Permutation Maricies" IEEE Transactions on Information Theory, vol. 50, No. 8 Aug. 8, 2004.
Gibson et al "Directions for Shingled-Write and Two-Dimensional Magnetic Recording System" Architectures: Synergies with Solid-State Disks Carnegie Mellon Univ. May 1, 2009.
K. Gunnam et al., "Next Generation iterative LDPC solutions for magnetic recording storage", invited paper. The Asilomar Conference on Signals, Systems, and Computers, Nov. 2008.
K. Gunnam et al., "Value-Reuse Properties of Min-Sum for GF(q)" (dated Oct. 2006) Dept. of ECE, Texas A&M University Technical Note, published about Aug. 2010.
K. Gunnam et al., "Value-Reuse Properties of Min-Sum for GF(q)"(dated Jul. 2008) Dept. of ECE, Texas A&M University Technical Note, published about Aug. 2010.
K. Gunnam "Area and Energy Efficient VLSI Architectures for Low-Density Parity-Check Decoders Using an On-The-Fly Computation" dissertation at Texas A&M University, Dec. 2006.
Han and Ryan, "Pinning Techniques for Low-Floor Detection/Decoding of LDPC-Coded Partial Response Channels", 5th International Symposium on Turbo Codes &Related Topics, 2008.
Hagenauer, J. et al A Viterbi Algorithm with Soft-Decision Outputs and its Applications in Proc. IEEE Globecom, pp. 47. 11-47 Dallas, TX Nov. 1989.
Lee et al., "Partial Zero-Forcing Adaptive MMSE Receiver for DS-CDMA Uplink in Multicell Environments" IEEE Transactions on Vehicular Tech. vol. 51, No. 5, Sep. 2002.
Lin et al "An efficient VLSI Architecture for non binary LDPC decoders"—IEEE Transaction on Circuits and Systems II vol. 57, Issue 1 (Jan. 2010) pp. 51-55.

Mohsenin et al., "Split Row: A Reduced Complexity, High Throughput LDPC Decoder Architecture", pp. 1-6, printed from www.ece.ucdavis.edu on Jul. 9, 2007.
Moon et al, "Pattern-dependent noise prediction in signal-dependent Noise," IEEE JSAC, vol. 19, No. 4 pp. 730-743, Apr. 2001.
Perisa et al "Frequency Offset Estimation Based on Phase Offsets Between Sample Correlations" Dept. of Info. Tech. University of Ulm 2005.
Sari H et al., "Transmission Techniques for Digital Terrestrial TV Broadcasting" IEEE Communications Magazine, IEEE Service Center Ny, NY vol. 33, No. 2 Feb. 1995.
Selvarathinam, A.: "Low Density Parity-Check Decoder Architecture for High Throughput Optical Fiber Channels" IEEE International Conference on Computer Design (ICCD '03) 2003.
Shu Lin, Ryan, "Channel Codes, Classical and Modern" 2009, Cambridge University Press, pp. 213-222.
Unknown, "Auto threshold and Auto Local Threshold" [online] [retrieved May 28, 2010] Retrieved from the Internet: <URL:http://www.dentristy.bham.ac.uk/landinig/software/autoth.
Vasic, B., "High-Rate Low-Density Parity-Check Codes Based on Anti-Pasch Affine Geometries," Proc ICC 2002, pp. 1332-1336.
Vasic, B., "High-Rate Girth-Eight Codes on Rectangular Integer Lattices", IEEE Trans. Communications, vol. 52, Aug. 2004, pp. 1248-1252.
Wang Y et al., "A Soft Decision Decoding Scheme for Wireless COFDM With Application to DVB-T" IEEE Trans. on Consumer elec., IEEE Service Center, NY,NY vo. 50, No. 1 Feb. 2004.
Weon-Cheol Lee et al., "Vitierbi Decoding Method Using Channel State Info. In COFDM System" IEEE Trans. on Consumer Elect., IEEE Service Center, NY, NY vol. 45, No. 3 Aug. 1999.
Xia et al, "A Chase-GMD algorithm of Reed-Solomon codes on perpendicular channels", IEEE Transactions on Magnetics, vol. 42 pp. 2603-2605, Oct. 2006.
Xia et al, "Reliability-based Reed-Solomon decoding for magnetic recording channels", IEEE International Conference on Communication pp. 1977-1981, May 2008.
Yeo et al., "VLSI Architecture for Iterative Decoders in Magnetic Storage Channels", Mar. 2001, pp. 748-755, IEEE trans. Magnetics, vol. 37, No. 2.
Youn, et al. "BER Perform. Due to Irrreg. of Row-Weight Distrib. of the Parity-Chk. Matirx in Irreg. LDPC Codes for 10-Gb/s Opt. Signls" Jrnl of Lightwave Tech., vol. 23, Sep. 2005.
Zhong et al., "Area-Efficient Min-Sum Decoder VLSI Architecture for High-Rate QC-LDPC Codes in Magnetic Recording", pp. 1-15, Submitted 2006, not yet published.
Zhong, "Block-LDPC: A Practical LDPC Coding System Design Approach", IEEE Trans. on Circuits, Regular Papers, vol. 5, No. 4, pp. 766-775, Apr. 2005.
Zhong et al., "Design of VLSI Implementation-Oriented LDPC Codes", IEEE, pp. 670-673, 2003.
Zhong et al., "High-Rate Quasi-Cyclic LDPC Codes for Magnetic Recording Channel with Low Error Floor", ISCAS, IEEE pp. 3546-3549, May 2006.
Zhong et al., "Iterative MAX-LOG-MAP and LDPC Detector/Decoder Hardware Implementation for Magnetic Read Channel", SRC TECHRON, pp. 1-4, Oct. 2005.
Zhong et al., "Joint Code-Encoder Design for LDPC Coding System VLSI Implementation", ISCAS, IEEE pp. 389-392, May 2004.
Zhong et al., "Quasi Cyclic LDPC Codes for the Magnetic Recording Channel: Code Design and VLSI Implementation", IEEE Transactions on Magnetics, v. 43, pp. 1118-1123, Mar. 2007.
Zhong, "VLSI Architecture of LDPC Based Signal Detection and Coding System for Magnetic Recording Channel", Thesis, RPI, Troy, NY, pp. 1-95, May 2006.

* cited by examiner

SYSTEMS AND METHODS FOR DUAL PROCESS DATA DECODING

BACKGROUND OF THE INVENTION

The present inventions are related to systems and methods for data processing, and more particularly to systems and methods for data decoding.

Various storage systems include data processing circuitry implemented with a data decoding circuit. In some cases, a belief propagation based decoder circuit is used. In such cases where high rate low density parity check codes are used, an error floor is more severe because short cycles are unavoidable. Such short cycles make the messages in the belief propagation decoder correlate quickly and degrade the performance. In contrast, a maximum likelihood decoder may be used as it does not exhibit the same limitations. However, such maximum likelihood decoders are typically too complex for practical implementation.

Hence, for at least the aforementioned reasons, there exists a need in the art for advanced systems and methods for data processing.

BRIEF SUMMARY OF THE INVENTION

The present inventions are related to systems and methods for data processing, and more particularly to systems and methods for data decoding.

Various embodiments of the present invention provide data processing systems. Such data processing systems include a data decoding system. The data decoding system includes a data decoder circuit and a simplified maximum likelihood value modification circuit. The data decoder circuit is operable to apply a data decode algorithm to a decoder input to yield a first decoded output and an indication of at least one point of failure of the first decoded output. The simplified maximum likelihood value modification circuit is operable to identify a symbol of the first decoded output associated with the point of failure, and to modify a subset of values associated with the identified symbol to yield a modified decoded output. In such embodiments, the data decoder circuit is further operable to apply the data decode algorithm to the decoder input guided by the modified decoded output to yield a second decoded output.

In some instances of the aforementioned embodiments, the simplified maximum likelihood value modification circuit includes a syndrome calculation circuit, an array calculator circuit, and an index calculator circuit. The syndrome calculation circuit is operable to calculate a syndrome based upon a number of symbols associated with the point of failure. The array calculator circuit is operable to calculate an array of possible hard decision values across the contributors to the point of failure. The index identifier circuit is operable to determine a candidate from the array as the identified symbol. In some cases, the simplified maximum likelihood value modification circuit further includes a likely symbol value selector circuit that is operable to determine whether the subset of values associated with the identified symbol includes one log likelihood ratio value or two log likelihood ratio values.

In some instances of the aforementioned embodiments, the data processing system is implemented as part of a storage device. In other instances of the aforementioned embodiments, the data processing system is implemented as part of a receiving device. In some cases, the data processing system is implemented as part of an integrated circuit. In some instances of the aforementioned embodiments, the data decode algorithm is a low density parity check algorithm, and the point of failure of the decoded output is a failure of a parity check equation implemented as part of the low density parity check algorithm. In some such cases, the low density parity check algorithm is a non-binary low density parity check algorithm. In other such cases, the low density parity check algorithm is a binary low density parity check algorithm. In various cases, the low density parity check algorithm is implemented as a belief propagation data decode algorithm.

In some instances of the aforementioned embodiments, the data processing system further includes a data detector circuit operable to apply a data detection algorithm to a data set to yield a detected output, wherein the decoder input is derived from the detected output. In some such instances, the data detection algorithm may be, but is not limited to, a maximum a posteriori data detection algorithm or a Viterbi detection algorithm. In various instances of the aforementioned embodiments, the data decoder circuit further includes a controller circuit operable to selectively control generation of the modified decoded output. The controller circuit may enable generation of the modified decoded output when: a number of iterations of the data decoder circuit applying the data decode algorithm to the decoder input is greater than a first threshold value; a number of points of failure corresponding to the first decoded output is less than a second threshold value; and the number of points of failure corresponding to the first decoded output is the same as the number of points of failure corresponding to a previous decoded output. In some cases, the first threshold value is three, and the second threshold value is ten.

Other embodiments of the present invention provide methods for data processing that include: applying a data decode algorithm by a data decoder circuit to a decoder input to yield a first decoded output and an indication of at least one point of failure of the first decoded output; identifying at least a first symbol and a second symbol associated with the point of failure of the first decoded output; calculating a syndrome including the first symbol and the second symbol; calculating an array of possible hard decision values across the contributors to the point of failure; determining an index corresponding to a candidate from the array as an identified symbol; determining a subset values associated with the identified symbol to be modified; modifying the subset of values to yield a modified decoded output; and applying the data decode algorithm by the data decoder circuit to the decoder input guided by the modified decoded output to yield a second decoded output.

In some cases, calculating the syndrome is done in accordance with the following equation:

$$s = \sum_{i=0}^{M} v_i \times e_i,$$

where $v_i$ corresponds to hard decision values of the variable nodes feeding a check node associated with the unsatisfied check, M is the number of variable nodes corresponding to the check node, and $e_i$ corresponds to the edge values connecting the variable nodes to the check node. In various cases, calculating the array of possible hard decision values across the contributors to the point of failure is done in accordance with the following equation:

$$HD'_{i,j} = (i \times e_i^{-1}) - HD_i, \text{ for } i \in \{1,2,\ldots M\}, j \in \{1,2,3\},$$

where j represents the contribution from the calculated syndrome, HDi represents the most likely symbol for a particular instance i, and $e_i^{-1}$ corresponds to an inverse edge value for the particular instance i. In one or more cases, determining the index is done in accordance with the following equation:

$$i^*_j = \arg\min_i(LLR_{HD_i\,XOR\,HD'_{i,j}})$$

where $j \in \{1, 2, 3\}$, and LLR is a log likelihood ratio of the most likely symbol.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present inventions are related to systems and methods for data processing, and more particularly to systems and methods for data decoding.

Various embodiments of the present invention provide data processing systems that include a data decoder circuit having a low density parity check decoder circuit and a simplified maximum likelihood decode value modification circuit that is selectively used to modify an output of the low density parity check decoder circuit when a possible trapping set is detected. As just one of many advantages, the aforementioned approach allows for using data decoder circuits that exhibit relatively low complexity such as, for example, a belief propagation decoder circuit, while using another decoder algorithm to correct errors that are not correctable by the low complexity decoder algorithm. As the errors to be corrected are localized by the belief propagation decoder circuit, the complexity of the other decoder circuit may be very low.

In some cases, selective modification of an output of the low density parity check decoder circuit is done based upon some conclusions about a subset of uncorrectable errors. In particular, it has been determined that: every unsatisfied checks is connected by one error symbol, the error symbol has the most significant ambiguity among all variable nodes associated with an unsatisfied checks, and the second most likely symbol associated with the error symbol is almost always the correct symbol. Based upon this, some embodiments of the present invention identify uncorrectable errors that seem to correspond to the above criteria, and modify the error symbol to use the second most likely value. In some cases, the uncorrectable error condition is referred to as a potential trapping set condition.

Figure 1A:
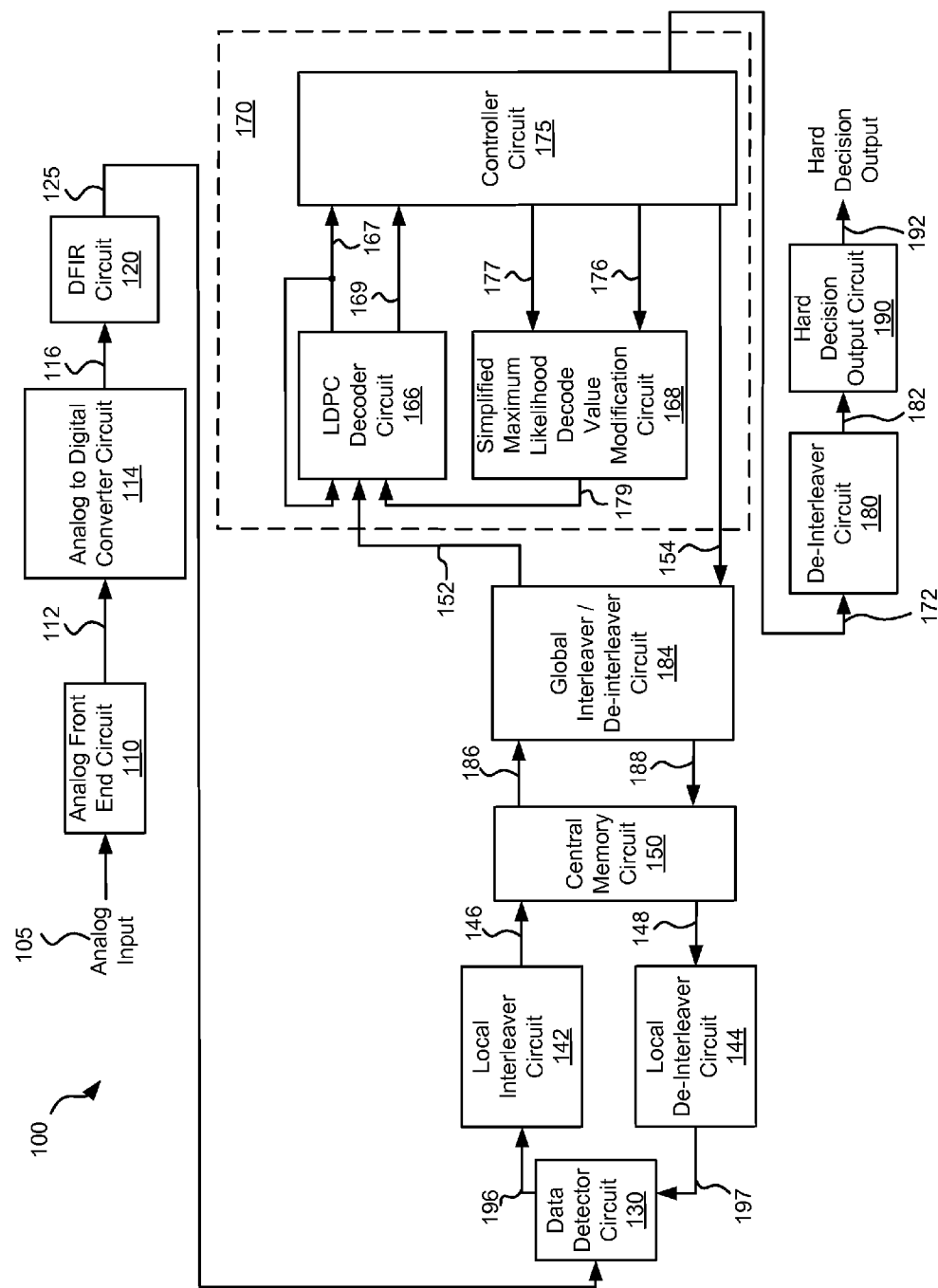
FIG. 1a shows a data processing circuit including a combination data decoder system including a combination of a low density parity check decoder circuit and a simplified maximum likelihood decode value modification circuit in accordance with one or more embodiments of the present invention.

Turning to FIG. 1a, a data processing circuit 100 is shown that includes a data decoding circuit 170 including a combination of a low complexity decoder circuit 166 and a simplified maximum likelihood decode value modification circuit 168 in accordance with one or more embodiments of the present invention. Data processing circuit 100 includes an analog front end circuit 110 that receives an analog signal 105. Analog front end circuit 110 processes analog signal 105 and provides a processed analog signal 112 to an analog to digital converter circuit 114. Analog front end circuit 110 may include, but is not limited to, an analog filter and an amplifier circuit as are known in the art. Based upon the disclosure provided herein, one of ordinary skill in the art will recognize a variety of circuitry that may be included as part of analog front end circuit 110. In some cases, analog signal 105 is derived from a read/write head assembly (not shown) that is disposed in relation to a storage medium (not shown). In other cases, analog signal 105 is derived from a receiver circuit (not shown) that is operable to receive a signal from a transmission medium (not shown). The transmission medium may be wired or wireless. Based upon the disclosure provided herein, one of ordinary skill in the art will recognize a variety of source from which analog input 105 may be derived.

Analog to digital converter circuit 114 converts processed analog signal 112 into a corresponding series of digital samples 116. Analog to digital converter circuit 114 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 116 are provided to an equalizer circuit 120. Equalizer circuit 120 applies an equalization algorithm to digital samples 116 to yield an equalized output 125. In some embodiments of the present invention, equalizer circuit 120 is a digital finite impulse response filter circuit as are known in the art. In some cases, equalizer 120 includes sufficient memory to maintain one or more codewords until a data detector circuit 130 is available for processing, and for multiple processes through data detector circuit 130.

Data detector circuit 130 is operable to apply a data detection algorithm to a received codeword or data set, and in some cases data detector circuit 130 can process two or more codewords in parallel. In some embodiments of the present invention, data detector circuit 130 is a Viterbi algorithm data detector circuit as are known in the art. In other embodiments of the present invention, data detector circuit 130 is a maximum a posteriori data detector circuit as are known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. Data detector circuit 130 is started based upon availability of a data set from equalizer circuit 120 or from a central memory circuit 150.

Upon completion, data detector circuit 130 provides a detector output 196. Detector output 196 includes soft data. As used herein, the phrase "soft data" is used in its broadest sense to mean reliability data with each instance of the reliability data indicating a likelihood that a corresponding bit position or group of bit positions has been correctly detected. In some embodiments of the present invention, the soft data or reliability data is log likelihood ratio data as is known in the art. Detected output 196 is provided to a local interleaver circuit 142. Local interleaver circuit 142 is operable to shuffle sub-portions (i.e., local chunks) of the data set included as detected output and provides an interleaved codeword 146 that is stored to central memory circuit 150. Interleaver circuit 142 may be any circuit known in the art that is capable of shuffling data sets to yield a re-arranged data set. Interleaved codeword 146 is stored to central memory circuit 150. Interleaved codeword 146 is comprised of a number of encoded sub-codewords designed to reduce the complexity of a downstream data decoder circuit while maintaining reasonable processing ability.

Once a data decoding circuit 170 is available, a previously stored interleaved codeword 146 is accessed from central memory circuit 150 as a stored codeword 186 and globally interleaved by a global interleaver/de-interleaver circuit 184. Global interleaver/De-interleaver circuit 184 may be any circuit known in the art that is capable of globally rearranging codewords. Global interleaver/De-interleaver circuit 184 provides a decoder input 152 input to low data decoding circuit 170.

Data decoding circuit 170 includes low density parity check decoder circuit 166, simplified maximum likelihood decode value modification circuit 168, and a controller circuit 175. Low density parity check decoder circuit 166 may be any decoder circuit known in the art that is less complex to implement than a maximum likelihood decoder circuit. In some embodiments of the present invention, low density parity check decoder circuit 166 is a belief propagation data decoder circuit as are known in the art. Such a belief propagation data decoder circuit may be implemented similar to that discussed in Pearl, Judea, "REVEREND BAYES ON INFERENCE ENGINES: A DISTRIBUTED HIERARCHAL APPROACH", AAAI-82 Proceedings, 1982. The entirety of the aforementioned reference is incorporated herein by reference for all purposes. Low density parity check decoder circuit 166 receives decoder input 152 and applies a decoder algorithm thereto to yield a decoder output 167. In addition, checksum indices 169 (i.e., an identification of a particular parity check equation) of any unsatisfied parity checks are generated. Decoder output 167 and checksum indices 169 are provided to controller circuit 175. In addition, decoder output 167 is fed back to low complexity decoder circuit 166 where it can be used to guide subsequent application of the decoder algorithm to decoder input 152.

Figure 1B:
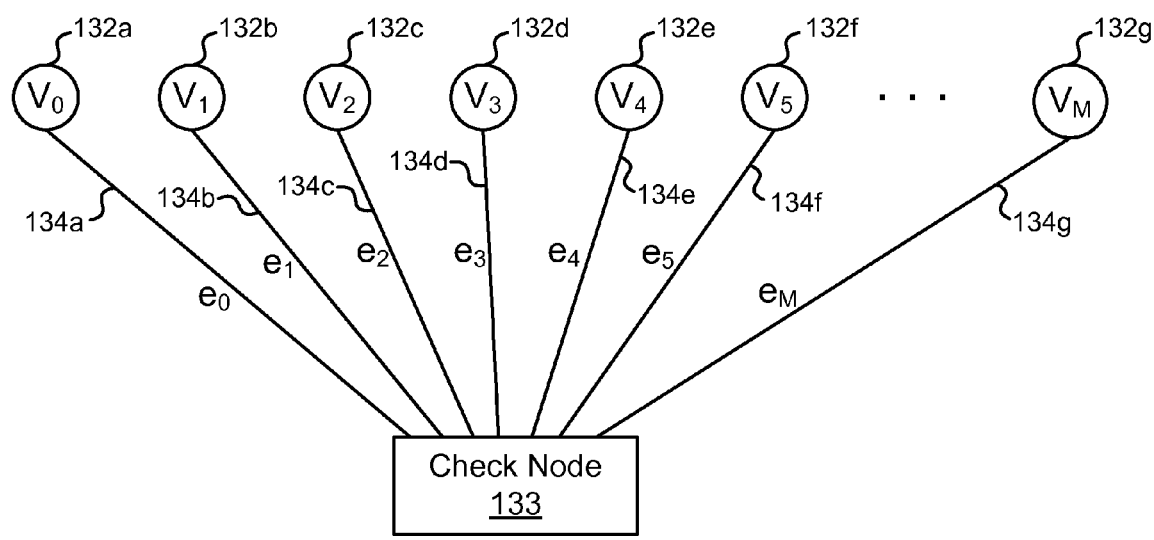
FIG. 1b shows a portion of a decoder algorithm graph having M variable nodes ($v_i$) connected to a check node where the checksum is unsatisfied via a M edges 134 that each have an edge value.

Controller circuit 175 utilizes decoder output 167 and checksum indices 169 to determine if a potential trapping set condition has occurred. Where a potential trapping set condition has occurred, a log likelihood ratio (LLR) subset output 177 (a portion of decoder output 167) and corresponding index outputs 176 (i.e., a portion of checksum indices 169 corresponding to LLR subset output 177) are provided by controller circuit 175 to simplified maximum likelihood decode value modification circuit 168. Simplified maximum likelihood decode value modification circuit 168 determines which symbols are associated with an unsatisfied check. Each unsatisfied check is indicated by index outputs 176. A total syndrome (s) is calculated for each of the unsatisfied checks in accordance with the following equation:

$$s = \sum_{i=0}^{M} v_i \times e_i,$$

where $v_i$ corresponds to hard decision values of the variable nodes feeding a check node associated with the unsatisfied check, M is the number of variable nodes corresponding to the check node, and $e_i$ corresponds to the edge values connecting the variable nodes to the check node. FIG. 1b shows a portion of a decoder algorithm graph 131 showing M variable nodes ($v_i$) 132 connected to a check node 133 where the checksum is unsatisfied via a M edges 134 that each have an edge value.

Simplified maximum likelihood decode value modification circuit 168 calculates an array of possible hard decision values across the contributors to the unsatisfied check in accordance with the following equation:

$$HD'_{i,j} = (i \times e_i^{-1}) - HD_i, \text{ for } i\epsilon\{1,2,\ldots M\}, j\epsilon\{1,2,3\}.$$

where j represents the contribution from the previously calculated total syndrome, $HD_i$ represents the most likely hard decision for the particular instance i, and $e_i^{-1}$ corresponds to the inverse edge value for the particular instance i. In this case, j is a value of 1 to 3 as the decoder is a non-binary decoder using two bit symbols with three non-zero LLR values for each symbol. Where a binary decoder is being used, $j\epsilon\{1\}$. Where three bit symbols are used, $j\epsilon\{1, 2, 3, 4, 5, 6, 7\}$. Thus, while the rest of this embodiment is discussed in relation to a two-bit symbol situation, one of ordinary skill in the art will recognize a variety of other binary and non-binary decoders to which the inventions may be applied.

Using the aforementioned array, simplified maximum likelihood decode value modification circuit 168 determines the most likely candidate from the array for modification. The most likely candidate is selected as the instance i in each row of the array (i.e., $j\epsilon\{1, 2, 3\}$) that has the lowest LLR value. This determination may be done in accordance with the following equation:

$$i^*_j = \arg \min_i (LLR_{HD_i \text{ XOR } HD'_{i,j}}), \text{ for } j\epsilon\{1,2,3\}.$$

This determination results in three index values $i_1$, $i_2$, $i_3$ where $j \in \{1, 2, 3\}$. Again, where a different number of bits per symbol are being used, the number of index values will be correspondingly different.

The LLR values associated with the index value $i^*_j$ are used by simplified maximum likelihood decode value modification circuit 168 whether one or two LLR values are to be modified. In particular, simplified maximum likelihood decode value modification circuit 168 determines whether modifying one LLR value associated with the symbol indicated by index value $i^*_j$ results in a greater change than modifying two LLR values associated with the symbol indicated by index value $i^*_j$. The determination may be made based upon the following comparison:

$$LLR_{HD_i \, XORHD'_{i,s}} \geq \sum_{j=1}^{3} LLR_{HD_i \, XORHD'_{i,j}} - LLR_{HD_i \, XORHD'_{i,s}}$$

Where the comparison indicates that modifying a single LLR value yields a greater change than modifying two LLR values of the symbol indicated by index value $i^*_j$, the following symbol modification is performed:

$$HD_{i^*_s} = HD_{i^*_j}.$$

Otherwise, where the comparison indicates that modifying a single LLR value does not yield a greater change than modifying two LLR values of the symbol indicated by index value $i^*_j$, the following symbol modifications are:

$$HD_{i^*_s} = HD_{i^*_j, j}, \text{ for } j \neq s.$$

The modified symbol (with one or two values modified) are provided as a replacement symbol output 179 to LDPC decoder circuit 166 that inserts the modified symbol into decoder output 167 prior to a subsequent application of the data decoder algorithm to decoder input 152.

In one particular embodiment of the present invention, a potential trapping set condition is considered to have occurred where the number of remaining unsatisfied checks after application of the decoder algorithm to decoder input 152 is less than ten, and the indexes corresponding to the remaining unsatisfied checks have not changed for at least two local iterations (i.e., passes through low complexity decoder circuit 166). In addition, in some cases, controller circuit 175 is not enabled to indicate a potential trapping set condition until at least four local iterations of decoder algorithm to decoder input 152 have completed. Based upon the disclosure provided herein, one of ordinary skill in the art will recognize other indicia that may be used to define the occurrence of a potential trapping set condition and/or to trigger operation of partial maximum likelihood decoder circuit 168.

In addition, controller circuit 175 determines whether the data decoding algorithm converged. Where the data decoding algorithm failed to converge and no more local iterations (iterations through low density parity check decoder circuit 166), controller circuit 175 provides a decoder output 154 (i.e., decoder output 167) back to central memory circuit 150 via global interleaver/de-interleaver circuit 184. Prior to storage of decoded output 154 to central memory circuit 150, decoded output 154 is globally de-interleaved to yield a globally de-interleaved output 188 that is stored to central memory circuit 150. The global de-interleaving reverses the global interleaving earlier applied to stored codeword 186 to yield decoder input 152. Once data detector circuit 130 is available, a previously stored de-interleaved output 188 is accessed from central memory circuit 150 and locally de-interleaved by a de-interleaver circuit 144. De-interleaver circuit 144 re-arranges decoder output 148 to reverse the shuffling originally performed by interleaver circuit 142. A resulting de-interleaved output 197 is provided to data detector circuit 130 where it is used to guide subsequent detection of a corresponding data set receive as equalized output 125.

Alternatively, where the data decoding algorithm converged, controller circuit 175 provides an output codeword 172 to a de-interleaver circuit 180. De-interleaver circuit 180 rearranges the data to reverse both the global and local interleaving applied to the data to yield a de-interleaved output 182. De-interleaved output 182 is provided to a hard decision output circuit 190. Hard decision output circuit 190 is operable to re-order data sets that may complete out of order back into their original order. The originally ordered data sets are then provided as a hard decision output 192.

An example of operation of controller circuit 175 is provided in the following pseudo-code:

If (number of unsatisfied checks==0)
{
provide decoder output 167 as output codeword 172
}
Else if (number of unsatisfied checks>0 && number of local iterations==maximum)
{
provide decoder output 167 as decoded output 154
}
Else if (number of unsatisfied checks>0 &&
[number of unsatisfied checks>=M OR
number of local iterations is <N OR
indexes 169 change from one local iteration to the next])
{
provide decoder output 167 as an input to low complexity decoder circuit 166
}
Else if (number of unsatisfied checks>0 &&
[number of unsatisfied checks<M AND
number of local iterations is >=N OR
indexes 169 do not change from one local iteration to the next])
{
provide LLR subset output 177 to partial maximum likelihood decoder circuit 168
}

Figure 1C:
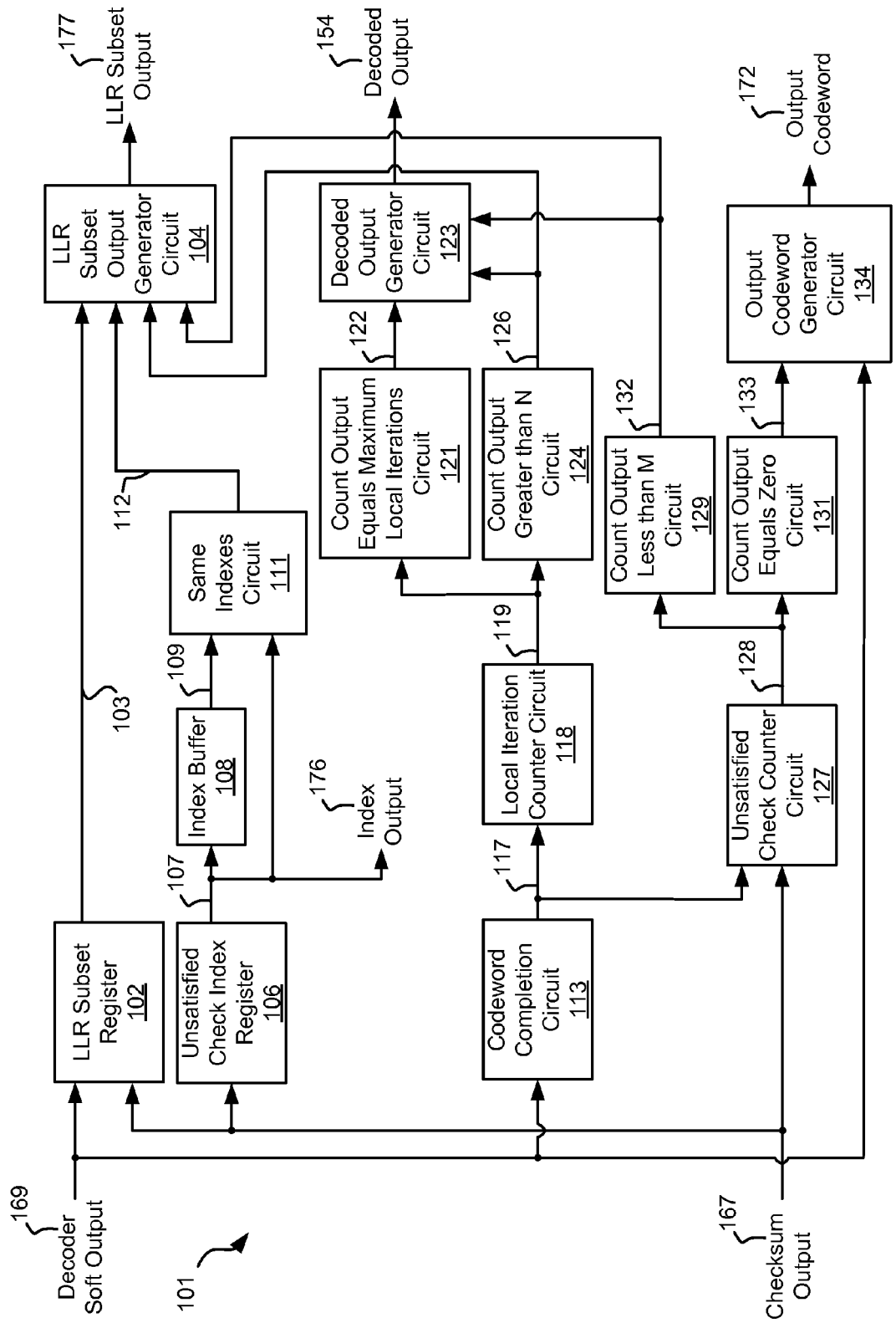
FIG. 1c depicts a controller circuit that may be used in relation to the decoder system of FIG. 1 in accordance with various embodiments of the present invention.

Turning to FIG. 1c, a controller circuit 101 that may be used in place of controller circuit 175 of FIG. 1 in accordance with various embodiments of the present invention. Controller circuit 101 includes an LLR subset register 102 that stores each element of decoder output 167 that corresponds to a non-zero value of a checksum identified as one of checksum indices 169. An LLR subset register output 103 is provided by LLR subset register 102. In addition, controller circuit 101 includes an unsatisfied check index register 106 that stores each index for which one or more instances of decoder output 167 stored to LLR subset register 102. Controller circuit 101 also includes a codeword completion circuit 113 that counts decoder outputs 167 to determine whether all instances of a codeword have been received. Where a completed codeword is received, a codeword complete output 117 is asserted high.

An unsatisfied check counter circuit 127 counts the number of non-zero parity check equation results (i.e., unsatisfied checks) indicated by checksum indices to yield an unsatisfied check count value 128. Unsatisfied check counter circuit 127 is reset whenever codeword complete output 117 is asserted such that a completed codeword is indicated. Hence, unsatisfied check count value 128 indicates the number of unsatisfied checks that occur for a given codeword. A count output equals zero circuit 131 indicates whether unsatisfied check count value 128 is equal to zero. Where unsatisfied check count value 128 is determined to be equal to zero, count output equals zero circuit 131 asserts a zero count output 133. Where zero count output 133 is asserted indicating that unsatisfied check count value 128 is zero, an output codeword generator circuit 134 provides decoder output 167 as output codeword 172.

In addition, a count output less than M circuit 129 determines whether unsatisfied check count value 128 is greater than zero and less than a value M. In some cases, M is ten. Based upon the disclosure provided herein, one of ordinary skill in the art will recognize other values of M that may be used in relation to different embodiments of the present invention. Where count output less than M circuit 129 determines that the value of unsatisfied check count value 128 is greater than zero and less than M, count output less than M circuit 129 asserts an M count output 132.

A local iteration counter circuit 118 receives codeword complete output 117 and counts the number of local iterations that have been applied to the particular codeword (received as decoder output 167). The number of local iterations is provided as a local iteration count value 119. A count output greater than N circuit receives local iteration count value 119 and asserts a count value greater than N output 126 whenever local iteration count value 119 is greater than N. In some cases, N is three. Based upon the disclosure provided herein, one of ordinary skill in the art will recognize other values of N that may be used in relation to different embodiments of the present invention. A count output equals maximum local iterations circuit 121 receives local iteration count value 119 and asserts a count value equals maximum local iterations output 122 whenever local iteration count value 119 equals the defined maximum number of local iterations. is greater than N. In some cases, N is three. Based upon the disclosure provided herein, one of ordinary skill in the art will recognize other values of N that may be used in relation to different embodiments of the present invention. Where M count output 132 indicates that the number of unsatisfied checks is not zero and count value equals maximum local iterations output 122 indicates the maximum number of local iterations have been performed, a decoded output generator circuit 123 provides a derivative of decoder output 167 as decoded output 154.

An index buffer 108 receives index values 107 from unsatisfied check index register 106 and stores them upon completion of a codeword (e.g., codeword complete output 117 is asserted). Index values 109 from index buffer 108 are compared with index values 107 by a same indexes circuit 111 to determine whether there has been a change over the last two local iterations to determine if the same parity check equations remain unsatisfied. Where the same parity check equations remain unsatisfied, same indexes circuit 111 asserts an unchanged output 112. In addition, index values 107 are provided as an index output 176. LLR subset output generator circuit 104 provides LLR subset register output 103 as LLR subset output 177 whenever same indexes output 112 is asserted, count value greater than N output 126 is asserted, and M count output 132 are all asserted.

Figure 1D:
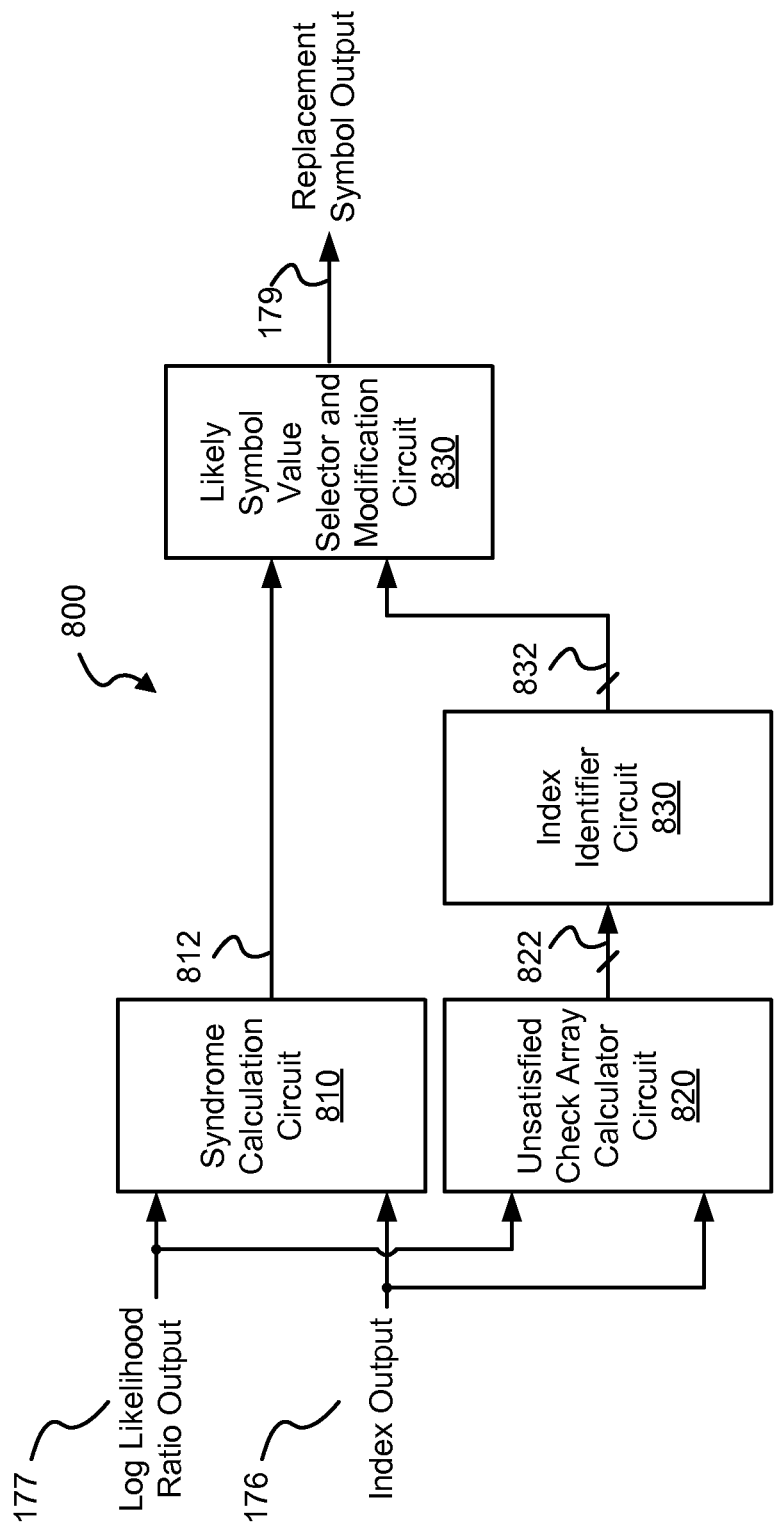
FIG. 1d depicts a simplified maximum likelihood decode value modification circuit that may be used in relation to the decoder system of FIG. 1 in accordance with various embodiments of the present invention.

Turning to FIG. 1d, a simplified maximum likelihood decode value modification circuit 800 is shown that may be used in relation to the decoder system of FIG. 1 in accordance with various embodiments of the present invention. Simplified maximum likelihood decode value modification circuit 800 includes a syndrome calculation circuit 810 that receives log likelihood ratio output 177 and index output 176, and based thereon determines which symbols are associated with a given unsatisfied check, and calculates a total syndrome for each of the unsatisfied checks in accordance with the following equation:

$$s = \sum_{i=0}^{M} v_i \times e_i,$$

where $v_i$ corresponds to hard decision values of the variable nodes feeding a check node associated with the unsatisfied check, M is the number of variable nodes corresponding to the check node, and $e_i$ corresponds to the edge values connecting the variable nodes to the check node. Referring to FIG. 1b, a portion of a decoder algorithm graph 131 showing M variable nodes ($v_i$) 132 connected to a check node 133 where the checksum is unsatisfied via a M edges 134 that each have an edge value. Syndrome calculation circuit 810 provides a syndrome output 812.

In addition, simplified maximum likelihood decode value modification circuit 800 includes an unsatisfied check array calculator circuit 820 that receives log likelihood ratio output 177 and index output 176, and based thereon determines which symbols are associated with a given unsatisfied check and calculates an calculates an array of possible hard decision values across the contributors to the unsatisfied check in accordance with the following equation:

$$HD'_{i,j} = (i \times e_i^{-1}) - HD_i, \text{ for } i \in \{1,2,\ldots M\}, j \in \{1,2,3\},$$

where j represents the contribution from the previously calculated total syndrome, $HD_i$ represents the most likely hard decision for the particular instance i, and $e_i^{-1}$ corresponds to the inverse edge value for the particular instance i. In this case, j is a value of 1 to 3 as the decoder is a non-binary decoder using two bit symbols with three non-zero LLR values for each symbol. Where a binary decoder is being used, $j \in \{1\}$. Where three bit symbols are used, $j \in \{1, 2, 3, 4, 5, 6, 7\}$. Thus, while the rest of this embodiment is discussed in relation to a two-bit symbol situation, one of ordinary skill in the art will recognize a variety of other binary and non-binary decoders to which the inventions may be applied. Unsatisfied check array calculator circuit 820 provides the calculated array as a vector output 822 to an index identifier circuit 832.

Index identifier circuit 830 uses vector output 822 representing the array of possible hard decision values to determine the most likely candidate from the array for modification. The most likely candidate is selected as the instance i in each row of the array (i.e., $j \in \{1, 2, 3\}$) that has the lowest LLR value. This determination may be done in accordance with the following equation:

$$i^*_j = \arg\min_i(LLR_{HD_i \text{ XOR } HD'_{i,j}}), \text{ for } j \in \{1,2,3\}.$$

This determination results in three index values $i_1, i_2, i_3$ where $j \in \{1, 2, 3\}$. Again, where a different number of bits per symbol are being used, the number of index values will be correspondingly different. This identified set of index values is provided as an index output 832 to a likely symbol value selector and modification circuit 830.

Likely symbol value selector and modification circuit 830 uses the LLR values indicated by index output to determine whether one or two LLR values are to be modified. In particular, likely symbol value selector and modification circuit 830 determines whether modifying one LLR value associated with the symbol indicated by index value $i^*_j$ results in a greater change than modifying two LLR values associated with the symbol indicated by index value i*$_j$. The determination may be made based upon the following comparison:

$$LLR_{HD_i \, XORHD_{i,s}^t} \geq \sum_{j=1}^{3} LLR_{HD_i \, XORHD_{i,j}^t} - LLR_{HD_i \, XORHD_{i,s}^t}$$

Where the comparison indicates that modifying a single LLR value yields a greater change than modifying two LLR values of the symbol indicated by index value i*$_j$, the following symbol modification is performed:

$HD_{i*_s} = HD_{i*_j}$.

Otherwise, where the comparison indicates that modifying a single LLR value does not yield a greater change than modifying two LLR values of the symbol indicated by index value i*$_j$, the following symbol modifications are:

$HD_{i*_s} = HD_{i*_{j,j}}$, for $j \neq s$.

The modified symbol (with one or two values modified) are provided as a replacement symbol output 179.

Figure 2A:
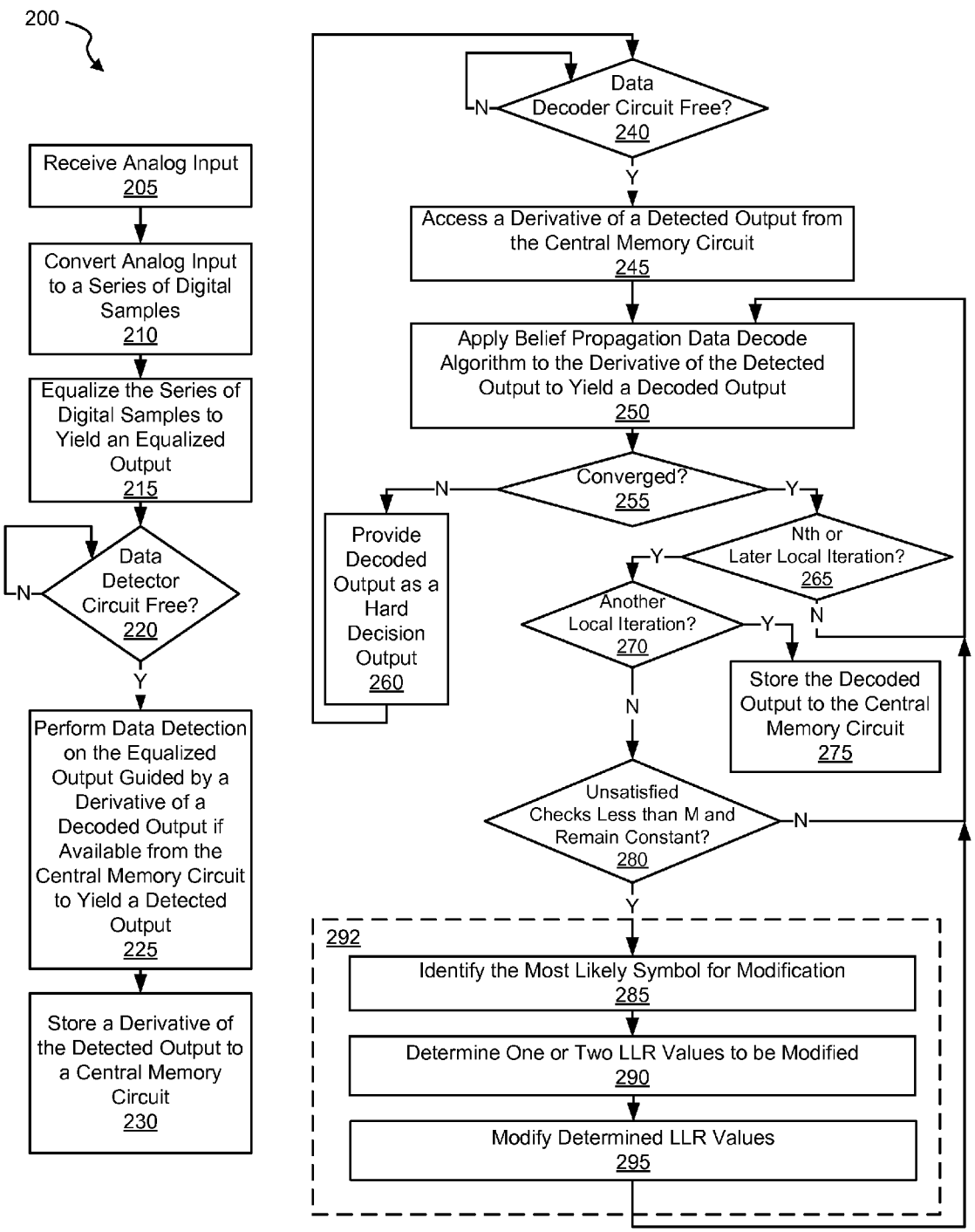
FIG. 2a is a flow diagram showing method for simplified maximum likelihood value modification data decoding in accordance with various embodiments of the present invention.

Turning to FIG. 2a, a flow diagram 200 shows a method for selectively combined data decoding in accordance with various embodiments of the present invention. Following flow diagram 200, an analog input is received (block 205). The analog input may be derived from, for example, a storage medium or a data transmission channel. Based upon the disclosure provided herein, one of ordinary skill in the art will recognize a variety of sources of the analog input. The analog input is converted to a series of digital samples (block 210). This conversion may be done using an analog to digital converter circuit or system as are known in the art. Of note, any circuit known in the art that is capable of converting an analog signal into a series of digital values representing the received analog signal may be used. The resulting digital samples are equalized to yield an equalized output (block 215). In some embodiments of the present invention, the equalization is done using a digital finite impulse response circuit as are known in the art. Based upon the disclosure provided herein, one of ordinary skill in the art will recognize a variety of equalizer circuits that may be used in place of such a digital finite impulse response circuit to perform equalization in accordance with different embodiments of the present invention.

It is determined whether a data detector circuit is available (block 220). Where a data detector circuit is available (block 220), a data detection algorithm is applied to the equalized output guided by a data set derived from a decoded output where available (e.g., the second and later iterations through the data detector circuit and the data decoder circuit) from a central memory circuit to yield a detected output (block 225). In some embodiments of the present invention, data detection algorithm is a Viterbi algorithm as are known in the art. In other embodiments of the present invention, the data detection algorithm is a maximum a posteriori data detector circuit as are known in the art. The data set derived from the decoded output maybe a de-interleaved version of the decoded data set. A signal derived from the detected output (e.g., a locally interleaved version of the detected output) is stored to the central memory to await processing by a data decoder circuit (block 230).

In parallel to the previously discussed data detection processing, it is determined whether a data decoder circuit is available (block 240). Where the data decoder circuit is available (block 240), a previously stored derivative of a detected output is accessed from the central memory (block 245). A low density parity check decode algorithm is applied to the derivative of the detected output to yield a decoded output (block 250). In some embodiments of the present invention, low density parity check decoder circuit 166 is a belief propagation data decoder circuit as are known in the art. Such a belief propagation data decoder circuit may be implemented similar to that discussed in Pearl, Judea, "REVEREND BAYES ON INFERENCE ENGINES: A DISTRIBUTED HIERARCHAL APPROACH", AAAI-82 Proceedings, 1982. It should be noted that other embodiments of the present may use different decode algorithms.

It is determined whether the decoded output converged (i.e., the original data set is recovered) (block 255). In some cases, such convergence is found where all of the checksum equations utilized as part of the low complexity decode algorithm are correct (i.e., there are no unsatisfied checks). Where the decode algorithm converged (block 255), the decoded output is provided as a hard decision output (block 260). Otherwise, where the decode algorithm failed to converge (block 255), it is determined whether the number of local iterations of the data decode algorithm on the current data set exceeded a threshold value N (block 265). In some cases, N is four. Based upon the disclosure provided herein, one of ordinary skill in the art will recognize other values of N that may be used in relation to different embodiments of the present invention. Where the number of local iterations has not exceeded the threshold value N (block 265), the processes of blocks 250-265 are repeated for the same data set using the previous decoded output as a guide.

Otherwise, where the number of local iterations has exceeded the threshold value N (block 265), it is determined whether another local iteration is to be performed (block 270). In some cases, this is determined by comparing the number of local iterations that have been completed to a defined threshold number. Where another local iteration is not called for (e.g., the number of local iterations equals a maximum number of local iterations) (block 270), the decoded output is stored to the central memory circuit where it awaits processing by the data detector circuit (i.e., another global iteration) (block 275). Otherwise, where it is determined that another local iteration is called for (e.g., the number of local iterations is not equal to a maximum number of local iterations) (block 270), it is determined whether the number of remaining unsatisfied checks is less than a threshold value M (block 280). In some cases, M is ten. Based upon the disclosure provided herein, one of ordinary skill in the art will recognize other values of M that may be used in relation to different embodiments of the present invention. Where the number of unsatisfied checks is not less than the threshold value M (block 280), the processes of blocks 250-280 are repeated for the same data set using the previous decoded output as a guide.

Otherwise, where the number of unsatisfied checks is less than the threshold value M (block 280), a symbol modification is performed (block 292). Symbol modification (block 292) includes identifying the most likely symbol corresponding to each unsatisfied check for modification (block 285). It is the determined whether one or two LLR values associated with each of the identified symbols are to be modified (block 290). The determine LLR values are then modified (block 295). The modified decoded output is then used to guide re-application of the low density parity check decoding algorithm to the derivative of the detected output (block 250), and the processes of blocks 255-292 are repeated.

Figure 2B:
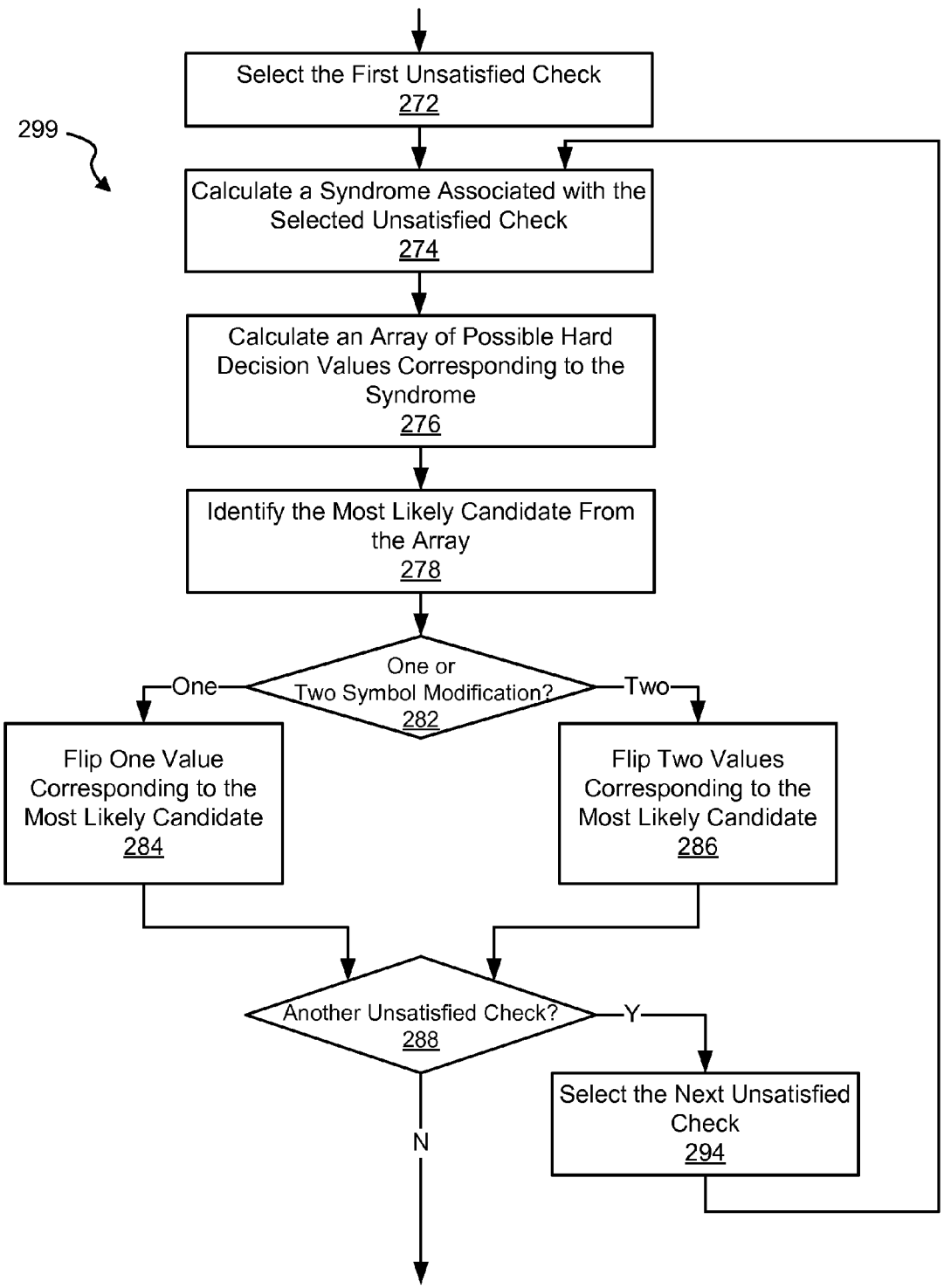
FIG. 2b is a flow diagram showing a method for utilizing the method of FIG. 2a in relation to a non-binary data decode process in accordance with some embodiments of the present invention.

Turning to FIG. 2b, a flow diagram 299 shows a method for performing the function of block 292 of FIG. 2a in relation to a non-binary data decode process in accordance with some embodiments of the present invention. In this example, each symbol is two bits representing four potential symbol values (i.e., '00', '01', '10', '11'). Following flow diagram 299, a first unsatisfied check is selected (block 272). In some cases, such an unsatisfied check is a parity check equation that did not yield a zero output after application of the data decode algorithm. Each unsatisfied check has a number of symbol values from which the unsatisfied check is calculated. A syndrome for all of the values associated with the selected unsatisfied check is calculated (block 274). In some cases, the syndrome is calculated in accordance with the following equation:

$$s = \sum_{i=0}^{M} v_i \times e_i,$$

where $v_i$ corresponds to hard decision values of the variable nodes feeding a check node associated with the unsatisfied check, M is the number of variable nodes corresponding to the check node, and $e_i$ corresponds to the edge values connecting the variable nodes to the check node. Referring to FIG. 1b, a portion of a decoder algorithm graph 131 showing M variable nodes ($v_i$) 132 connected to a check node 133 where the checksum is unsatisfied via a M edges 134 that each have an edge value. Syndrome calculation circuit 810 provides a syndrome output 812.

An array of possible hard decision values are calculated across the contributors to the unsatisfied check in accordance with the following equation:

$$HD'_{i,j} = (i \times e_i^{-1}) - HD_i, \text{ for } i \in \{1, 2, \ldots M\}, j \in \{1, 2, 3\},$$

where j represents the contribution from the previously calculated total syndrome, HD, represents the most likely hard decision for the particular instance i, and $e_i^{-1}$ corresponds to the inverse edge value for the particular instance i. In this case, j is a value of 1 to 3 as the decoder is a non-binary decoder using two bit symbols with three non-zero LLR values for each symbol. Where a binary decoder is being used, j∈{1}. Where three bit symbols are used, j∈{1, 2, 3, 4, 5, 6, 7}. Thus, while the rest of this embodiment is discussed in relation to a two-bit symbol situation, one of ordinary skill in the art will recognize a variety of other binary and non-binary decoders to which the inventions may be applied.

An index identifying the most likely candidate from the aforementioned array is selected (block 278). The most likely candidate is selected as the instance i in each row of the array (i.e., j∈{1, 2, 3}) that has the lowest LLR value. The index may be calculated in accordance with the following equation:

$$i^*_j = arg\ min_i(LLR_{HD_i\ XOR\ HD'_{i,j}}), \text{ for } j \in \{1,2,3\}.$$

This determination results in three index values $i_1, i_2, i_3$ where j∈{1, 2, 3}. Again, where a different number of bits per symbol are being used, the number of index values will be correspondingly different.

It is then determined whether one or two LLR values of the symbol identified by the aforementioned index are to be modified (block 282). In particular, it is determined whether modifying one LLR value associated with the symbol indicated by index value $i^*_j$ results in a greater change than modifying two LLR values associated with the symbol indicated by index value $i^*_j$. The determination may be made based upon the following comparison:

$$LLR_{HD_i\ XORHD'_{i,s}} \geq \sum_{j=1}^{3} LLR_{HD_i\ XORHD'_{i,j}} - LLR_{HD_i\ XORHD'_{i,s}}$$

Where the comparison indicates that modifying a single LLR value yields a greater change than modifying two LLR values of the symbol indicated by index value $i^*_j$ (block 282), then one LLR value of the symbol identified by the index is modified (block 284). The modification may be made in accordance with the following equation:

$$HD_{i^*_s} = HD_{i^*_j}.$$

Otherwise, where the comparison indicates that modifying a single LLR value does not yield a greater change than modifying two LLR values of the symbol indicated by index value $i^*_j$ (block 282), then two LLR values of the symbol identified by the index are modified (block 286). The modification may be made in accordance with the following equation:

$$HD_{i^*_s} = HD_{i^*_j,j}, \text{ for } j \neq s.$$

It is then determined whether another unsatisfied check remains (block 288). Where another unsatisfied check remains (block 288), the next unsatisfied check is selected (block 2294), and the processes of blocks 272-288 are repeated to further modify the decoded output. Alternatively, where no additional unsatisfied checks remain (block 288), the process is returned to that discussed in relation to FIG. 2a where the modified decoded output is used to guide re-application of the low density parity check decoding algorithm to the derivative of the detected output (block 250).

Figure 3:
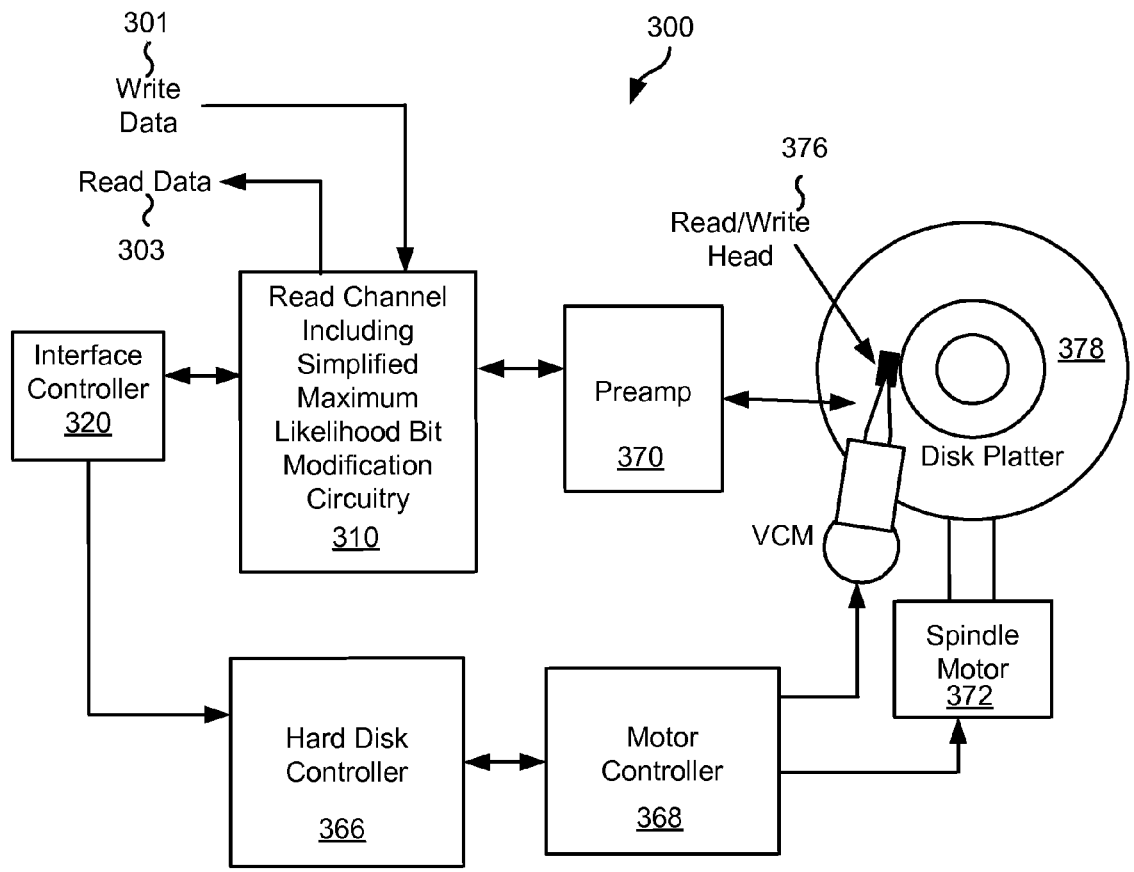
FIG. 3 shows a storage device including simplified maximum likelihood decode value modification circuitry in accordance with one or more embodiments of the present invention.

Turning to FIG. 3, a storage device 300 is shown including simplified maximum likelihood value modification circuitry in accordance with one or more embodiments of the present invention. Storage device 300 may be, for example, a hard disk drive. Storage device 300 also includes a preamplifier 370, an interface controller 320, a hard disk controller 366, a motor controller 368, a spindle motor 372, a disk platter 378, and a read/write head assembly 376. Interface controller 320 controls addressing and timing of data to/from disk platter 378. The data on disk platter 378 consists of groups of magnetic signals that may be detected by read/write head assembly 376 when the assembly is properly positioned over disk platter 378. In one embodiment, disk platter 378 includes magnetic signals recorded in accordance with either a longitudinal or a perpendicular recording scheme.

In a typical read operation, read/write head assembly 376 is accurately positioned by motor controller 368 over a desired data track on disk platter 378. Motor controller 368 both positions read/write head assembly 376 in relation to disk platter 378 and drives spindle motor 372 by moving read/write head assembly to the proper data track on disk platter 378 under the direction of hard disk controller 366. Spindle motor 372 spins disk platter 378 at a determined spin rate (RPMs). Once read/write head assembly 378 is positioned adjacent the proper data track, magnetic signals representing data on disk platter 378 are sensed by read/write head assembly 376 as disk platter 378 is rotated by spindle motor 372. The sensed magnetic signals are provided as a continuous, minute analog signal representative of the magnetic data on disk platter 378. This minute analog signal is transferred from read/write head assembly 376 to read channel circuit 310 via preamplifier 370. Preamplifier 370 is operable to amplify the minute analog signals accessed from disk platter 378. In turn, read channel circuit 310 decodes and digitizes the received analog signal to recreate the information originally written to disk platter 378. This data is provided as read data 303 to a receiving circuit. A write operation is substantially the opposite of the preceding read operation with write data 301 being provided to read channel circuit 310. This data is then encoded and written to disk platter 378.

During operation, data decoding applied to the information received from disk platter 378 may not converge. Where it is determined that there is a possible trapping set or other impediment to convergence, a simplified maximum likelihood value modification circuit identifies a symbol associated with an unsatisfied check that exhibits the most significant ambiguity. This symbol is then modified and used to replace a corresponding symbol in a previously generated decoded output prior to a subsequent application of a data decode algorithm to a decoder input. Such symbol modification circuitry may be implemented similar to that discussed above in relation to FIGS. 1a-1d, and/or may be done using a process similar to that discussed above in relation to FIGS. 2a-2b.

It should be noted that storage system may utilize SATA, SAS or other storage technologies known in the art. Also, it should be noted that storage system 300 may be integrated into a larger storage system such as, for example, a RAID (redundant array of inexpensive disks or redundant array of independent disks) based storage system. It should also be noted that various functions or blocks of storage system 300 may be implemented in either software or firmware, while other functions or blocks are implemented in hardware.

Figure 4:
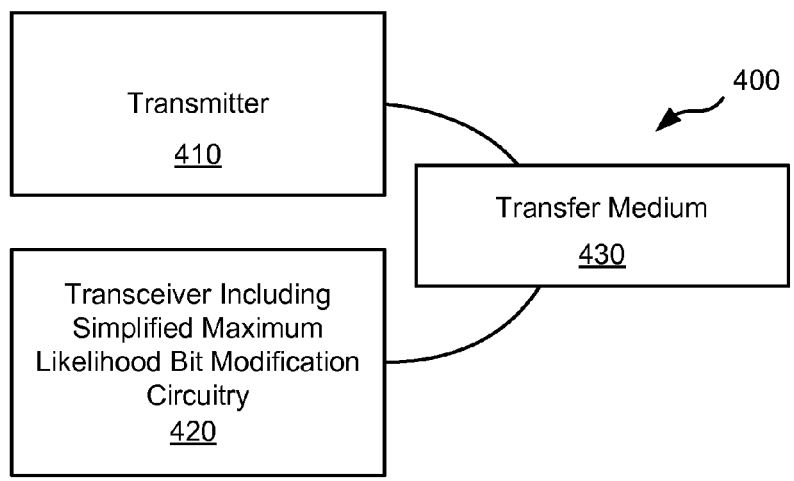
FIG. 4 shows a data transmission system including simplified maximum likelihood decode value modification circuitry in accordance with various embodiments of the present invention.

Turning to FIG. 4, a data transmission system 400 including simplified maximum likelihood value modification circuitry in accordance with various embodiments of the present invention. Data transmission system 400 includes a transmitter 410 that is operable to transmit encoded information via a transfer medium 430 as is known in the art. The encoded data is received from transfer medium 430 by receiver 420. Transceiver 420 incorporates data decoder circuitry. While processing received data, received data is converted from an analog signal to a series of corresponding digital samples, and the digital samples are equalized to yield an equalized output. The equalized output is then provided to a data processing circuit including both a data detector circuit and a data decoder circuit. Data is passed between the data decoder and data detector circuit via a central memory allowing for variation between the number of processing iterations that are applied to different data sets. It should be noted that transfer medium 430 may be any transfer medium known in the art including, but not limited to, a wireless medium, an optical medium, or a wired medium. Based upon the disclosure provided herein, one of ordinary skill in the art will recognize a variety of transfer mediums that may be used in relation to different embodiments of the present invention.

During operation, data decoding applied to the information received via transfer medium 430 may not converge. Where it is determined that there is a possible trapping set or other impediment to convergence, a simplified maximum likelihood value modification circuit identifies a symbol associated with an unsatisfied check that exhibits the most significant ambiguity. This symbol is then modified and used to replace a corresponding symbol in a previously generated decoded output prior to a subsequent application of a data decode algorithm to a decoder input. Such symbol modification circuitry may be implemented similar to that discussed above in relation to FIGS. 1a-1d, and/or may be done using a process similar to that discussed above in relation to FIGS. 2a-2b.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the data processing system comprising:
   a data decoding system including:
      a data decoder circuit operable to apply a data decode algorithm to a decoder input to yield a first decoded output and an indication of at least one point of failure of the first decoded output;
      a simplified maximum likelihood value modification circuit operable to identify a symbol of the first decoded output associated with the point of failure, and to modify a subset of values associated with the identified symbol to yield a modified decoded output; and
   wherein the data decoder circuit is further operable to apply the data decode algorithm to the decoder input guided by the modified decoded output to yield a second decoded output.

2. The data processing system of claim 1, wherein the simplified maximum likelihood value modification circuit comprises:
   a syndrome calculation circuit operable to calculate a syndrome based upon a number of symbols associated with the point of failure;
   an array calculator circuit operable to calculate an array of possible hard decision values across the contributors to the point of failure; and
   an index identifier circuit operable to determine a candidate from the array as the identified symbol.

3. The data processing system of claim 2, wherein the simplified maximum likelihood value modification circuit further comprises:
   a likely symbol value selector circuit operable to determine whether the subset of values associated with the identified symbol includes one log likelihood ratio value or two log likelihood ratio values.

4. The data processing circuit of claim 1, wherein the data processing system is implemented as part of a device selected from a group consisting of: a storage device, and a receiving device.

5. The data processing system of claim 1, wherein the data processing system is implemented as part of an integrated circuit.

6. The data processing system of claim 1, wherein the data decode algorithm is a low density parity check algorithm, and wherein the point of failure of the decoded output is a failure of a parity check equation implemented as part of the low density parity check algorithm.

7. The data processing system of claim 6, wherein the low density parity check algorithm is selected from a group consisting of: a non-binary low density parity check algorithm, and a binary low density parity check algorithm.

8. The data processing system of claim 6, wherein the low density parity check algorithm is implemented as a belief propagation data decode algorithm.

9. The data processing system of claim 1, wherein the data processing system further comprises:
a data detector circuit operable to apply a data detection algorithm to a data set to yield a detected output, wherein the decoder input is derived from the detected output.

10. The data processing system of claim 9, wherein the data detection algorithm is selected from a group consisting of: a maximum a posteriori data detection algorithm and a Viterbi detection algorithm.

11. The data processing system of claim 1, wherein the data decoder circuit further comprises:
a controller circuit operable to selectively control generation of the modified decoded output.

12. The data processing system of claim 11, wherein the controller circuit enables generation of the modified decoded output when:
a number of iterations of the data decoder circuit applying the data decode algorithm to the decoder input is greater than a first threshold value;
a number of points of failure corresponding to the first decoded output is less than a second threshold value; and
the number of points of failure corresponding to the first decoded output is the same as the number of points of failure corresponding to a previous decoded output.

13. The data processing system of claim 12, wherein the first threshold value is three, and the second threshold value is ten.

14. A method for data processing, the method comprising:
applying a data decode algorithm by a data decoder circuit to a decoder input to yield a first decoded output and an indication of at least one point of failure of the first decoded output;
identifying at least a first symbol and a second symbol associated with the point of failure of the first decoded output;
calculating a syndrome including the first symbol and the second symbol;
calculating an array of possible hard decision values across the contributors to the point of failure;
determining an index corresponding to a candidate from the array as an identified symbol;
determining a subset values associated with the identified symbol to be modified;
modifying the subset of values to yield a modified decoded output; and
applying the data decode algorithm by the data decoder circuit to the decoder input guided by the modified decoded output to yield a second decoded output.

15. The method of claim 14, wherein calculating the syndrome is done in accordance with the following equation:

$$s = \sum_{i=0}^{M} v_i \times e_i,$$

wherein $v_i$ corresponds to hard decision values of variable nodes corresponding to the point of failure of a check node, M is the number of variable nodes corresponding to the check node, and $e_i$ corresponds to edge values connecting the variable nodes to the check node.

16. The method of claim 15, wherein calculating the array of possible hard decision values across the contributors to the point of failure is done in accordance with the following equation:

$$\text{Array}_{i,j} = (j \times e_i^{-1}) - HD_i, \text{ for } i \in \{1,2,\ldots M\}, j \in \{1,2,3\},$$

wherein j represents the contribution from the calculated syndrome, $HD_i$ represents the most likely symbol for a particular instance i, and $e_i^{-1}$ corresponds to an inverse edge value for the particular instance i.

17. The method of claim 16, wherein determining the index is done in accordance with the following equation:

$$\text{index}_j = \arg\min_i(LLR_{HD_i \text{ XOR Array}_{i,j}}),$$

wherein $j \in \{1, 2, 3\}$, and wherein LLR is a log likelihood ratio of the most likely symbol.

18. A storage device, the storage device comprising:
a storage medium;
a head assembly disposed in relation to the storage medium and operable to provide a sensed signal corresponding to information on the storage medium;
a read channel circuit including:
an analog to digital converter circuit operable to sample an analog signal derived from the sensed signal to yield a series of digital samples;
an equalizer circuit operable to equalize the digital samples to yield a data set;
a data detector circuit operable to apply a data detection algorithm to the data set to yield a detected output; and
a data decoding system including:
a data decoder circuit operable to apply a data decode algorithm to a decoder input to yield a first decoded output and an indication of at least one point of failure of the first decoded output;
a simplified maximum likelihood value modification circuit operable to identify a symbol of the first decoded output associated with the point of failure, and to modify a subset of values associated with the identified symbol to yield a modified decoded output; and
wherein the data decoder circuit is further operable to apply the data decode algorithm to the decoder input guided by the modified decoded output to yield a second decoded output.

19. The storage device of claim 18, wherein the simplified maximum likelihood value modification circuit comprises:
a syndrome calculation circuit operable to calculate a syndrome based upon a number of symbols associated with the point of failure;
an array calculator circuit operable to calculate an array of possible hard decision values across the contributors to the point of failure;
an index identifier circuit operable to determine a candidate from the array as the identified symbol; and a likely symbol value selector circuit operable to determine whether the subset of values associated with the identified symbol includes one log likelihood ratio value or two log likelihood ratio values.

20. The storage device of claim 18, wherein the simplified maximum likelihood value modification circuit further comprises:
  a controller circuit operable to selectively control generation of the modified decoded output, wherein the controller circuit enables generation of the modified decoded output when:
    a number of iterations of the data decoder circuit applying the data decode algorithm to the decoder input is greater than a first threshold value;
    a number of points of failure corresponding to the first decoded output is less than a second threshold value; and
    the number of points of failure corresponding to the first decoded output is the same as the number of points of failure corresponding to a previous decoded output.

* * * * *